US007610181B2

(12) United States Patent
Simpson (10) Patent No.: US 7,610,181 B2
(45) Date of Patent: Oct. 27, 2009

(54) ARCHITECTURAL STRUCTURE DESIGN METHODS, ARCHITECTURAL STRUCTURE DESIGN APPARATUSES, AND ARTICLES OF MANUFACTURE

(75) Inventor: Jack Simpson, Coeur D'Alene, ID (US)

(73) Assignee: Chief Architect, Inc., Coeur D'Alene, ID (US)

( * ) Notice: Subject to any disclaimer, the term of this patent is extended or adjusted under 35 U.S.C. 154(b) by 539 days.

(21) Appl. No.: 11/332,009

(22) Filed: Jan. 13, 2006

(65) Prior Publication Data

US 2007/0168166 A1      Jul. 19, 2007

(51) Int. Cl.
*G06F 17/50* (2006.01)
(52) U.S. Cl. .......................................... 703/1; 345/420
(58) Field of Classification Search ............... 703/1
See application file for complete search history.

(56) References Cited

U.S. PATENT DOCUMENTS

| | | | | |
|---|---|---|---|---|
| 5,640,812 A | * | 6/1997 | Crowley et al. | 52/90.1 |
| 5,857,294 A | * | 1/1999 | Castro | 52/81.2 |
| 7,098,909 B2 | * | 8/2006 | Hayano et al. | 345/420 |
| 7,389,255 B2 | * | 6/2008 | Formisano | 705/26 |

OTHER PUBLICATIONS

Borderbund Properties, LLC, "3D Home Architect 5.0 User's Guide", pp. i-xii, 79-94.*
Langdon et al, "AutoCAD Architectural Desktop", Cadence Channel, Oct. 1998.*
Laycock et al, "Automatically Generating Roof Models from Building Footprints", WSCG 2003, Feb. 3-7, 2003.*
Simmons, Thomas, "ArchiCAD, Version 7.0, Step by Step Tutorial", US Version, GRAPHISOFT R&D, First Edition, 1998-2001, pp. 1-19, 110-118, i, ii.*
Chief Architect 9.5 Roof's Designer's Toolkit Companion Workbook; 2004; pp. 1-146.

* cited by examiner

*Primary Examiner*—Paul L Rodriguez
*Assistant Examiner*—Mary C Jacob
(74) *Attorney, Agent, or Firm*—Wells St. John P.S.

(57) ABSTRACT

Architectural structure design methods, architectural structure design apparatuses, and articles of manufacture are described according to some aspects of the disclosure. In one aspect, an architectural structure design method includes displaying a building plan of an architectural structure, accessing user input with respect to the building plan, modifying the building plan responsive to the user input, using the processing circuitry, analyzing the building plan to identify the presence of conditions appropriate to create a roof for the architectural structure, generating the roof responsive to the analyzing, and displaying the architectural structure comprising the roof after the generating.

24 Claims, 4 Drawing Sheets

ARCHITECTURAL STRUCTURE DESIGN METHODS, ARCHITECTURAL STRUCTURE DESIGN APPARATUSES, AND ARTICLES OF MANUFACTURE

TECHNICAL FIELD

This disclosure relates to architectural structure design methods, architectural structure design apparatuses, and articles of manufacture.

BACKGROUND

Personal computing devices are ubiquitous at homes, schools and the workplace. The ever-increasing capabilities and functions provided by computing devices have led to their usage in numerous applications. Some applications for computing devices have been introduced to assist users with design and visualization of architectural structures, such as residential homes, offices, etc. These applications have been designed to generate structural designs, to facilitate modifications of structural designs and to provide visual representations of structures defined by the designs. At least some aspects of the disclosure describe apparatus, methods and articles of manufacture which may further facilitate generation and modification of architectural structural designs.

BRIEF DESCRIPTION OF THE DRAWINGS

Embodiments of the disclosure are described below with reference to the following accompanying drawings.

DETAILED DESCRIPTION

According to one embodiment of the disclosure, an architectural structure design apparatus is configured to facilitate design, creation and/or modification of architectural structures. For example, one embodiment of the apparatus is configured to automatically generate roofs of newly created, existing or modified architectural structures as described in further detail below.

According to one aspect of the disclosure, an architectural structure design apparatus comprises a display configured to depict visual images, a user interface configured to receive a plurality of user inputs, and processing circuitry coupled with the display and the user interface and configured to access the user inputs, to control the display to depict a building plan of an architectural structure responsive to the user inputs, to automatically provide a roof for the architectural structure of the building plan, and to control the display to depict the roof.

According to another aspect of the disclosure, an architectural structure design apparatus comprises a display configured to generate visual images, a user interface configured to receive a plurality of user inputs, and processing circuitry coupled with the display and the user interface and configured to access the user inputs, control the display to depict a building plan of an architectural structure responsive to the user inputs, to automatically provide a roof for architectural structure of the building plan, and to control the display to depict the architectural structure of the building plan including the roof.

According to an additional aspect of the disclosure, an article of manufacture comprises media comprising programming configured to cause processing circuitry to perform processing comprising controlling a display to depict an architectural structure comprising a roof, accessing a plurality of user inputs at a plurality of moments in time, responsive to the user inputs, performing a plurality of respective modifications to the architectural structure at a plurality of moments in time, for at least one of modifications, automatically altering the roof in the absence of user input specifying alteration of the roof, for at least an other of the modifications, maintaining the roof unchanged and in substantially, the same configuration as prior to the other of the modifications, and controlling the display to depict the architectural structure comprising the modifications and the roof after the altering.

Figure 1:
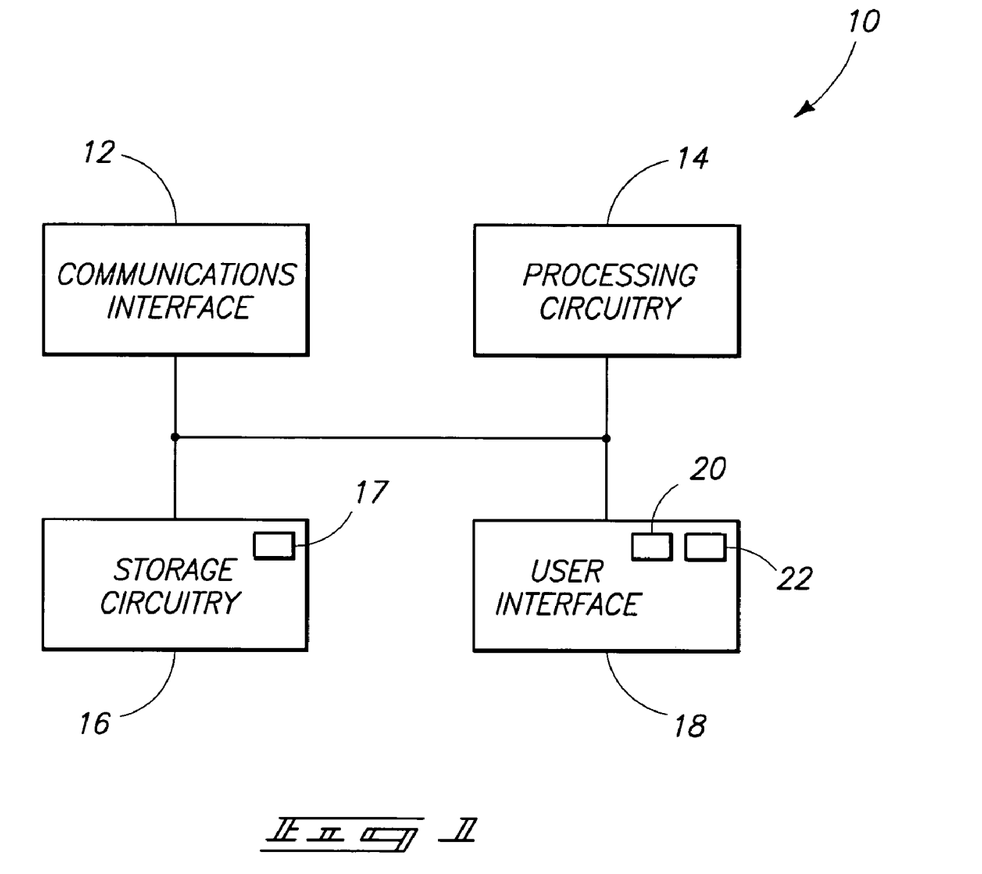
FIG. 1 is a block diagram of an architectural structure design apparatus according to one embodiment.

Referring to FIG. 1, an architectural structure design apparatus 10 is illustrated according to one embodiment. The illustrated exemplary architectural structure design apparatus 10 includes a communications interface 12, processing circuitry 14, storage circuitry 16, and a user interface 18. For example, in exemplary embodiments, apparatus 10 may be embodied as a personal computer (PC) utilizing a Windows® Operating System available from Microsoft Corporation, a Macintosh® computer available from Apple Computer, Inc., a work station, or other suitable configuration. Further, other configurations of architectural structure design apparatus 10 are possible in other embodiments including more, less and/or alternative components.

Communications interface 12 is arranged to implement communications of architectural structure design apparatus 10 with respect to external devices and/or networks (not shown). For example, communications interface 12 may be arranged to communicate information bi-directionally with respect to architectural structure design apparatus 10. Communications interface 12 may be implemented as a network interface card (NIC), serial or parallel connection, USB port, Firewire interface, flash memory interface, floppy disk drive, or any other suitable arrangement for communicating with respect to architectural structure design apparatus 10.

In one embodiment, processing circuitry 14 is arranged to process data, control data access and storage, issue commands, and control other desired operations of apparatus 10. Processing circuitry 14 may comprise circuitry configured to implement desired programming provided by appropriate media in at least one embodiment. For example, the processing circuitry 14 may be implemented as one or more of a processor or other structure configured to execute executable instructions including, for example, software or firmware instructions, and/or hardware circuitry. Exemplary embodiments of processing circuitry 14 include hardware logic, PGA, FPGA, ASIC, state machines, or other structures alone or in combination with a processor. These examples of processing circuitry 14 are for illustration and other configurations are possible.

The storage circuitry 16 is configured to store programming such as executable code or instructions (e.g., software or firmware), electronic data, databases, or other digital information, and may include processor-usable media. Processor-usable media may be embodied in any computer program product or article of manufacture 17 which can contain, store, or maintain programming, data or digital information for use by or in connection with an instruction execution system including processing circuitry 14 in the exemplary embodiment. For example, exemplary processor-usable media may include any one of physical media such as electronic, magnetic, optical, electromagnetic, infrared or semiconductor media. Some more specific examples of processor-usable media include, but are not limited to, a portable magnetic computer diskette, such as a floppy diskette, zip disk, hard drive, random-access memory, read only memory, flash memory, cache memory, or other configurations capable of storing programming, data, or other digital information.

At least some embodiments or aspects described herein may be implemented using programming stored within appropriate storage circuitry 16 described above or communicated via a network or other transmission media and configured to control appropriate processing circuitry 14. For example, programming may be provided via appropriate media including, for example, embodied within articles of manufacture 17, embodied within a data signal (e.g., modulated carrier wave, data packets, digital representations, etc.) communicated via an appropriate transmission medium, such as a communication network (e.g., the Internet or a private network), wired electrical connection, optical connection or electromagnetic energy, for example, via communications interface 12, or provided using other appropriate communication structure or medium. Exemplary programming including processor-usable code may be communicated as a data signal embodied in a carrier wave in but one example.

User interface 18 is configured to interact with a user including receiving user input and/or conveying information to a user. In the depicted embodiment, user interface 18 includes an input device 20 and an output device 22. An exemplary input device 20 is arranged to receive tactile input from a user and may be embodied as a keyboard and/or mouse. Further, output device 22 is configured to convey information to a user and may be embodied as a display (e.g., monitor) configured to depict visual images for observation by a user. Other configurations of user interface 18 are possible in other embodiments.

Figure 2:
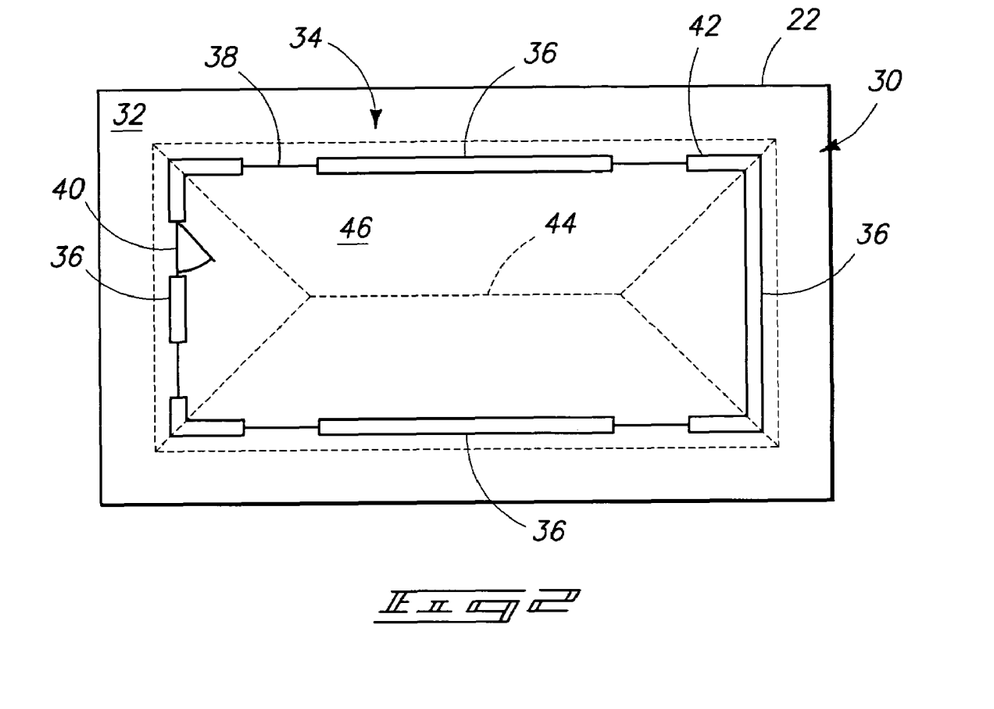
FIG. 2 is an illustrative representation of an image generated by a display and which comprises a building plan according to one embodiment.

Referring to FIG. 2, an exemplary image 30 generated using output device 22 is shown. The image 30 includes a workspace 32 and a building plan 34. Workspace 32 is provided for example as a desktop to a user for drawing or modifying images, such as building plan 34. Building plan 34 may refer to a plan view representation of an architectural structure in one embodiment although building plan 34 may be represented in other representations or views in other embodiments. In addition, apparatus 10 may display the architectural structure corresponding to building plan 34 in other views apart from the depicted building plan 34. For example, a user may select interior views (e.g., isometric, side), exterior views (e.g., isometric, side), or any other views desired with respect to the architectural structure being processed. In addition, building plan 34 and one or more alternative view may be simultaneously depicted using output device 22 (e.g., in a tiled arrangement).

A user may manipulate input device 20 to create building plan 34 in one embodiment. In another embodiment, a file of a previously generated building plan 34 may be accessed from storage circuitry 16 or other source and used to create images 30 and a user may interact with the building plan 34 to implement desired modifications.

The depicted exemplary building plan 34 corresponds to an architectural structure, such as a house, although other structures may be generated and/or modified. A user may configure building plan 34 to include a plurality of objects which may include walls 36, windows 38, and a door 40 in the illustrated example. A user may draw the walls 36 during the design of an architectural structure by using input device 20 comprising a mouse and similar to drawing on paper in one example. The user may add additional objects such as interior walls to the building plan 34.

As mentioned above, architectural structure design apparatus 10 is configured to facilitate design, creation and/or modification of architectural structures in one embodiment. In one implementation, processing circuitry 14 is configured to monitor operations of apparatus 10 with respect to creation and/or modification of architectural structures and to generate modifications and/or additions to the architectural structures being processed. In one example, processing circuitry 14 may implement modifications and/or additions to the building plan 34 based upon different conditions. The modifications and/or additions may be made by processing circuitry 14 automatically based upon monitoring of the conditions. Exemplary automatic modifications and/or additions may refer to modifications and/or additions made in the absence of specific user input instructing processing circuitry 14 to make the modifications and/or additions. For example, processing circuitry 14 may monitor a building plan and if one or more conditions are met, implement the modifications and/or additions without input from the user instructing processing circuitry 14 to make the specific appropriate modifications and/or additions at times when the modifications or additions are made. Processing circuitry 14 may monitor newly created building plans, existing building plans and/or building plans being modified with respect to the condition(s) to determine if respective modifications and/or additions are appropriate. In one embodiment described further below, the processing circuitry 14 may automatically generate and/or modify a roof in the absence of instructions from a user which instruct generation or modification of the roof at moments in time when generation and/or modification is appropriate.

According to one implementation, apparatus 10 is configured to automatically generate roofs of newly created, existing and/or modified architectural structures. Apparatus 10 may be configured to automatically make modifications to an existing roof (e.g., synchronize a configuration of an existing roof substantially on the fly with respect to modifications made to other portions of the building plan 34). In one embodiment described below, automatic generation and/or modification of roofs may be responsive and corresponding to changes made to the building plan 34 by the user.

Still referring to FIG. 2, exemplary automatic operations of processing circuitry 14 are described. In the illustrated example, a user may draw the building plan 34 including the walls 36 in plan view. In one embodiment, processing circuitry 14 may be configured to monitor the drawing operations of the user with respect to one or more defined conditions to determine whether automatic generation and/or modification of the building plan 34 is appropriate. In one example with respect to automatic roof generation and/or modification aspects, a defined condition may include determining whether generation and/or modification of a roof is appropriate. In such an embodiment, an exemplary defined condition monitored by processing circuitry 14 may include analyzing the building plan 34 to determine whether it has reached a determined or defined level of completion (e.g., predefined by a user or perhaps a default which may be set at a moment in time prior to the generation or modification of the building plan being analyzed). For example, monitoring may include determining whether the user has provided sufficient information where the processing circuitry 14 may identify the structure to be roofed. In a more specific example, the processing circuitry 14 may determine whether the user has defined an enclosure (which may include one or more exterior walls and perhaps other objects) to a sufficient degree to define a footprint 42 of the structure or a portion of the structure to be roofed. For example, processing circuitry 14 may detect the connection of four exterior walls 36 adequately defining footprint 42 of a structure to be roofed. Once the processing circuitry 14 detects that the user has sufficiently defined the footprint 42 of the structure to be roofed, the processing circuitry 14 may automatically generate a roof (e.g., shown with respect to reference 44 in FIG. 2 and corresponding to the structure to be roofed) and control the display to depict the building plan 34 having the roof 44. The automatic generation of the roof 44 may be performed by processing circuitry 14 in the absence of instruction from the user to generate the roof 44 at a moment in time when the roof 44 is generated.

Roof 44 generated by processing circuitry 14 includes a plurality of roof planes 46 in the form of hip roof planes in the example of FIG. 2. Other types of roofs 44 may be specified and generated in other embodiments. For example, when generation or modification of a roof 44 is appropriate, processing circuitry 14 may access stored properties from storage circuitry 16 and which specify details for constructing roof 44. Default properties may be used, or alternatively, a user may tailor individual roof properties as desired (e.g., to control the generation of a gable roof as opposed to a hip roof).

Figure 3:
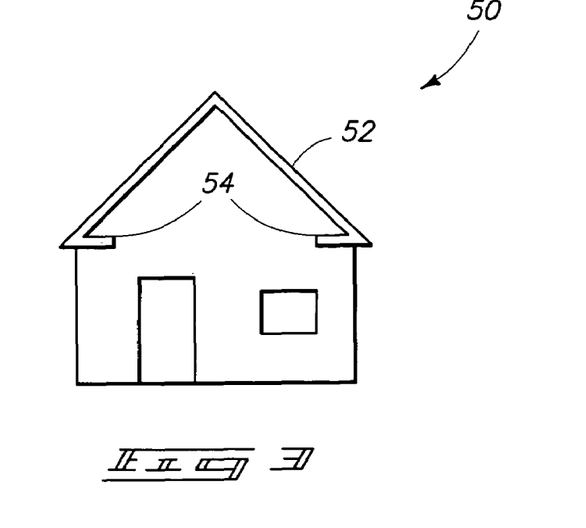
FIG. 3 is an illustrative representation of an image generated by a display and which comprises a front view of an architectural structure according to one embodiment.

Other properties may be specified by the user or default with respect to roof 44. For example, with reference to FIG. 3, an exemplary architectural structure 50 in the form of a house is illustrated. A user may specify that apparatus 10 automatically include roof returns 54 when roof 52 is generated or modified. Aspects of roof returns 54, such as length (e.g., 36") and/or type (e.g., hip or gable), may be specified by the properties. Additional properties of roof 44, such as overhangs as shown in the example of FIG. 2, may also be specified.

In addition, processing circuitry 14 may automatically generate the roof 44 according to known or defined specifications of building plan 34. For example, if the length and width of the structure to be enclosed are known from footprint 42, processing circuitry 14 may appropriately automatically generate roof 44 corresponding to the specified dimensions.

Once a roof 44 is generated, processing circuitry 14 may also monitor modifications made (e.g., by the user) with respect to other portions of the building plan 34 at one or more moments in time to determine whether one or more modifications (e.g., updates) to roof 44 are to be made in accordance with the modifications to the building plan 34. Processing circuitry 14 may disregard some modifications as not impacting roof 44 as well as automatically perform modifications to roof 44 responsive to other modifications. For example, if a user moves an interior wall within the defined footprint 42 to be roofed, the processing circuitry 14 may disregard the modification as not impacting the roof 44. However, other modifications to building plan 34, such as the movement of an external wall 36 which defines the footprint 42 to be roofed, may be monitored by processing circuitry 14 and processing circuitry 14 may modify the roof 44 accordingly (e.g., redesign the roof 44 to correspond to the footprint 42 defined by the moved exterior wall 36).

In one embodiment, processing circuitry 14 is configured to automatically monitor user edits or modifications to building plan 34 and to automatically modify the roof 34 if appropriate. In particular, processing circuitry 14 may automatically monitor user modifications and, if appropriate, automatically modify roof 44 in the absence of direct instructions or commands by the user to modify the roof 44 (e.g., a user moves an exterior wall 36 without providing any instruction, command or modification of the roof 44). For other modifications not deemed to impact the roof 44, processing circuitry 14 may disregard the user input with respect to roof 44 and maintain the roof 44 as constructed prior to receipt of the respective modifications.

Figure 4:
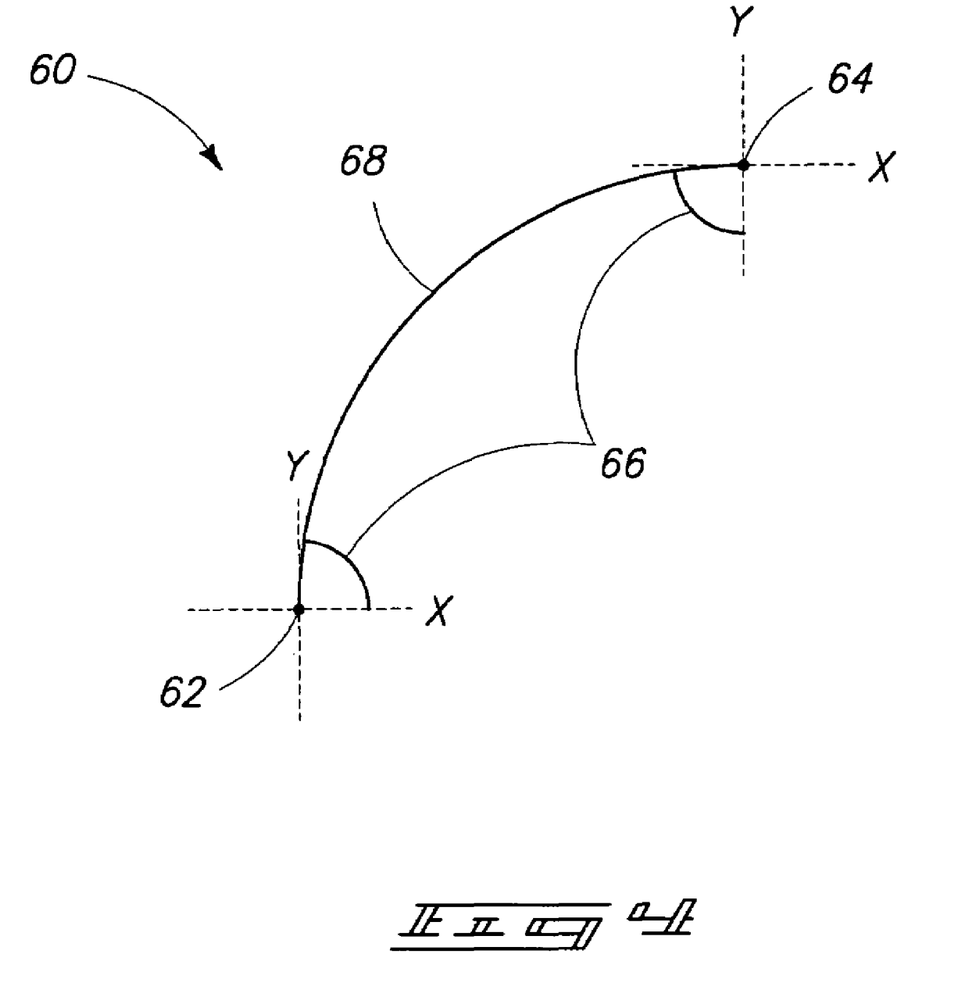
FIG. 4 is an illustrative representation of a curved roof according to one embodiment.

Referring to FIG. 4, a side view of an exemplary curved portion of a roof plane 60 is shown according to one embodiment. Processing circuitry 14 is configured to generate roof planes 60 individually comprising one or more of a plurality curved portions in at least one implementation. The roof plane 60 depicted in FIG. 4 is configured wherein an entirety of the individual roof plane has a constant radius. In other embodiments, an individual roof plane may include a plurality of portions individually having different radii.

A plurality of points 62, 64 are shown in FIG. 4 wherein the point 62 may correspond to a location in space at the top of an exterior wall of the building plan where the roof is to join the structure being designed (e.g., point 62 may correspond to an eave of an existing flat roof plane that will be changed to a curved roof section) and point 64 may correspond to a location in space corresponding to a ridgeline of two joined roof planes of the structure. The angles 66 (defined by a tangent to line 68 and the x axis at point 62 and a tangent to line 68 and the y axis at point 64) may be defined to be the same and specified (e.g., by a user) to result in the provision of roof 60 intersecting points 62, 64 tangentially to angles 66 to provide a respective desired radius in one possible implementation. In another embodiment, a user may merely specify the radius of line 68. The roof 66 may curve upwardly or downwardly corresponding to the specification of angles 66.

In another embodiment, a single roof plane may include a plurality of portions having different respective radii as mentioned above. One of points 62, 64 of one of the portions may comprise an end point of an adjacent connected portion of a roof plane in one embodiment and may be referred to as a joined point. Angles defined by the line passing through the respective joined point and an x axis passing through the joined point may be the same in one embodiment to provide a flowing transition between the plurality of roof portions. Different roof portions of the same roof plane may be curved upwardly and/or downwardly in different embodiments.

Figure 5:
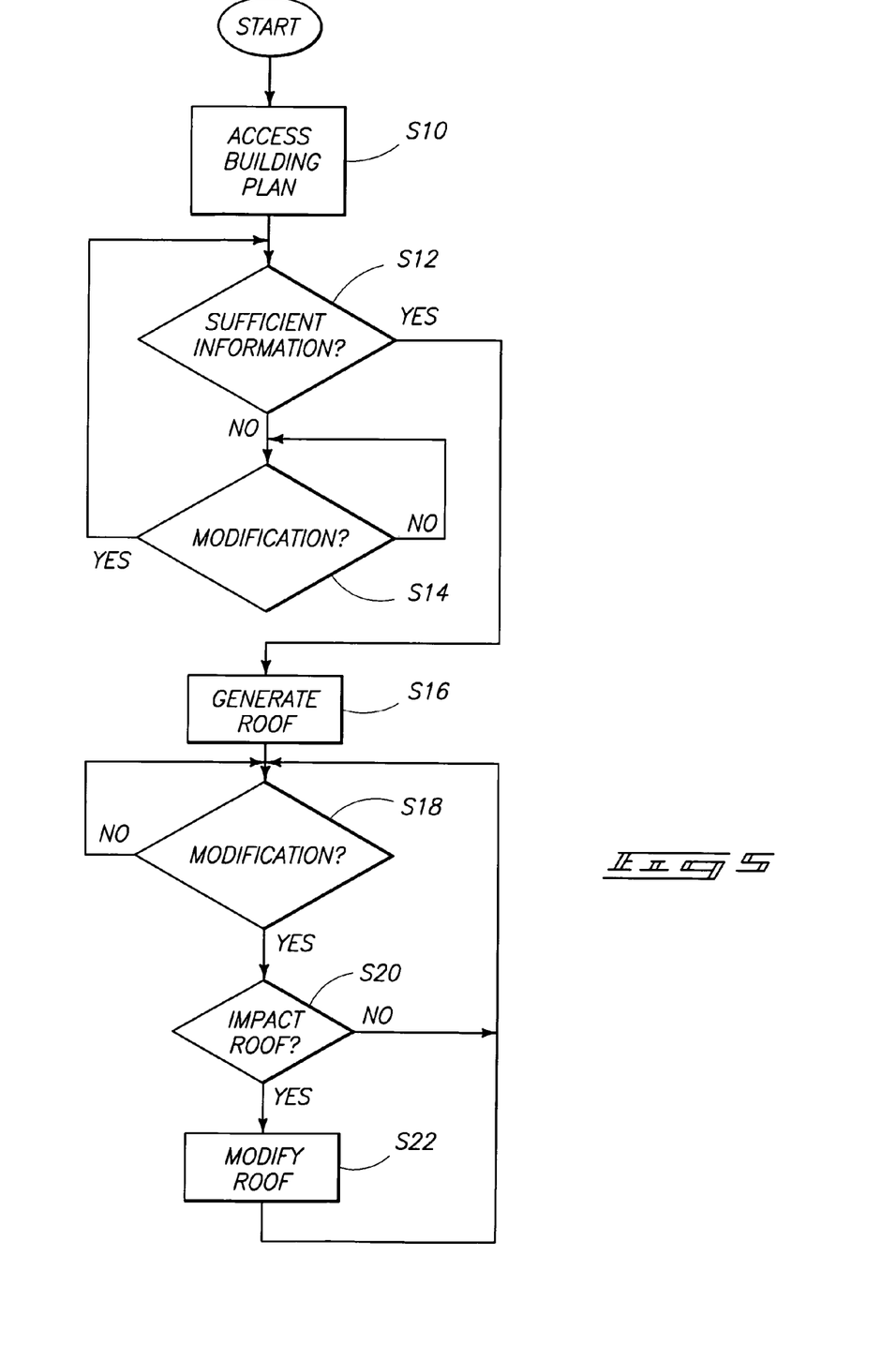
FIG. 5 is a flow chart of an exemplary method according to one embodiment.

Referring to FIG. 5, an exemplary method for generating and/or modifying a roof of an architectural structure is shown. The exemplary method may be executed by apparatus 10 in one embodiment. For example, in one embodiment, processing circuitry 14 of apparatus 10 may execute ordered instructions (e.g., software) to implement the depicted method. Other methods are possible including more, less and/or alternative steps.

At a step S10, a building plan is accessed. The building plan may have been previously generated and accessed from a stored file, generated by a user in real time on the fly, or otherwise appropriately accessed.

At a step S12, it is determined whether sufficient information is provided by the building plan to add a roof to the building plan. In illustrative examples described above, the processing circuitry may determine whether the building plan has reached a defined level of completion.

The process proceeds to step S14 if the condition of step S12 is negative. At step S14, modifications to the building plan, for example responsive to user input, are detected and the process loops to step S12 if appropriate where the processing circuitry again attempts to determine if sufficient information is available.

If the condition of step S12 is affirmative, the process proceeds to a step S16 to automatically generate a roof for the architectural structure of the building plan being analyzed. The processing circuitry may automatically generate the roof when sufficient information is available and without input from the user specifying construction of the roof in the described embodiment.

The processing circuitry may access defined properties and specifications to generate the roof in one embodiment. In one example, the roof may be specified by default settings to be a hip style roof. In such an embodiment, the processing circuitry may access the pitch of the roof (e.g., specified by a user or set by default) and the dimensions of the footprint of the building plan to use geometry to determine the intersections (e.g., ridges and valleys) of the hip roof planes for the respective walls of the building plan. In one more specific exemplary implementation, hip roof planes may be created by the processing circuitry and positioned at and coupled with the baselines or tops of respective exterior walls of the architectural structure. Accordingly, the respective exterior walls have respective dimensions corresponding to the tops of the respective exterior walls in one embodiment. The hip roof planes may be angled at respective pitches. In the described exemplary roof generation implementation, the hip roof planes may be extended at the defined pitches and intersections at ridges or valleys with other hip roof planes of the architectural structure may be identified. In accordance with one embodiment, portions of the hip roof planes which extend past the identified ridges or valleys may be trimmed to form the configurations of the respective hip roof planes which are displayed. Other methods for generating the roofs may be used in other embodiments.

In addition, the processing circuitry may access other properties which may specify whether roof returns, overhung portions and/or other roof features are to be generated. The processing circuitry may also control the display to depict the generated roof with respect to the building plan.

At a step S18, the processing circuitry determines whether modifications to the building plan are desired. The process loops at step S18 to monitor for the presence of modifications in the illustrated exemplary embodiment.

If a modification to the building plan is detected, the process proceeds to step S20 to determine whether the modification impacts the roof. For example, the processing circuitry may classify the modification as one which impacts the roof (e.g., moving an exterior wall) or one that does not impact the roof (e.g., moving an interior wall). The process may loop to step S18 to monitor for the presence of an additional modification if the condition of step S20 is negative.

If the condition of step S20 is affirmative, the process proceeds to a step S22 wherein the processing circuitry may automatically modify the roof according to the respective modification to the building plan. For example, if a user has modified the building plan by moving an exterior wall (i.e., adjusting the footprint of the structure to be roofed), the processing circuitry may adjust the roof according to the new dimensions of the footprint. Other modifications to the roof are possible according to other types of respective modifications made to the building plan.

In compliance with the statute, the disclosure has been described in language more or less specific as to structural and methodical features. It is to be understood, however, that the disclosure is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. An architectural structure design method comprising:
displaying a building plan of an architectural structure;
accessing user input with respect to the building plan;
modifying the building plan responsive to the user input;
using processing circuitry, analyzing the building plan to identify the presence of conditions appropriate to create a roof for the architectural structure;
using the processing circuitry, automatically generating the roof responsive to the analyzing and in the absence of user input which instructs the generating of the roof; and
displaying the architectural structure comprising the roof after the generating.

2. The method of claim 1 wherein the processing circuitry automatically performs the analyzing and the identification of the presence of the conditions.

3. The method of claim 2 wherein the analyzing and identification is performed in the absence of user input with respect to the roof.

4. The method of claim 1 wherein the generating is responsive to an occurrence of the conditions comprising enclosure of a plurality of exterior walls of the architectural structure to define an enclosed footprint of the architectural structure.

5. The method of claim 1 wherein the accessing comprises accessing a plurality of user inputs with respect to the building plan and the modifying comprises performing a plurality of modifications to the building plan at a plurality of moments in time responsive to the plurality of user inputs, and wherein the analyzing comprises performing a plurality of analyses after the plurality of modifications.

6. The method of claim 5 further comprising modifying the roof for some of the modifications of the building plan responsive to the analyzing, and wherein the displaying comprises displaying the architectural structure after the modifying of the roof.

7. The method of claim 6 wherein one of the some of the modifications comprises a modification not directly with respect to modifying the roof.

8. The method of claim 7 wherein one of the some of the modifications comprises moving an exterior wall of the architectural structure.

9. The method of claim 6 further comprising maintaining the roof without modification for others of the modifications of the building plan responsive to the analyses corresponding to respective ones of the others of the modifications.

10. The method of claim 5 wherein individual ones of the analyses are automatically performed responsive to respective ones of the modifications and in the absence of user input with respect to the analyses.

11. The method of claim 1 wherein the generating the roof comprises generating the roof comprising at least one curved portion.

12. An architectural structure design apparatus comprising:
- a display configured to depict visual images;
- a user interface configured to receive a plurality of user inputs; and
- processing circuitry coupled with the display and the user interface and configured to access the user inputs, to control the display to depict a building plan of an architectural structure responsive to the user inputs, to automatically provide a roof for the architectural structure of the building plan, and to control the display to depict the roof; and wherein the processing circuitry is configured to identify a condition wherein a roof is appropriate for the architectural structure and to automatically provide the roof as a result of the identification and in the absence of user input which instructs the processing circuitry to provide the roof.

13. The apparatus of claim 12 wherein the condition comprises the building plan having reached a defined level of completion.

14. The apparatus of claim 13 wherein the defined level of completion is enclosure of a footprint of at least a portion of the architectural structure to be roofed.

15. The apparatus of claim 12 wherein the automatic provision of the roof comprises generating an initial roof.

16. The apparatus of claim 12 wherein the automatic provision of the roof comprises modifying an existing roof.

17. The apparatus of claim 12 wherein the user interface is configured to receive a plurality of user inputs individually configured to modify the building plan, and wherein the processing circuitry is further configured to implement modifications of the building plan responsive to the user inputs configured to modify the building plan, and to analyze the modifications of the building plan, and wherein the processing circuitry is configured to provide the roof comprising automatically updating the roof responsive to the analysis of at least some of the modifications, and maintaining the roof without modification responsive to the analysis of a plurality of others of the modifications.

18. The apparatus of claim 17 wherein the processing circuitry is configured to automatically perform the analyses and the updates to the roof in the absence of user input.

19. The apparatus of claim 12 further comprising storage circuitry configured to store properties with respect to the roof and wherein the processing circuitry is configured to access the properties and to provide the roof according to the properties.

20. An article of manufacture comprising:
- a computer-readable storage medium encoded with programming configured to cause processing circuitry to perform processing comprising:
  - controlling a display to depict an architectural structure comprising a roof;
  - accessing a plurality of user inputs at a plurality of moments in time;
  - responsive to the user inputs, performing a plurality of respective modifications to the architectural structure at a plurality of moments in time;
  - for at least one of the modifications, automatically altering the roof in the absence of user input which instructs alteration of the roof;
  - for at least an other of the modifications, maintaining the roof unchanged and in substantially the same configuration as prior to the other of the modifications; and
  - controlling the display to depict the architectural structure comprising the modifications and the roof after the altering.

21. The article of claim 20 wherein the medium comprises programming configured to cause the processing circuitry to perform processing comprising:
- detecting a building plan of the architectural structure reaching a defined level of completion; and
- automatically generating the roof for the structure responsive to the detecting and in the absence of user input which instructs the generation of the roof.

22. The article of claim 20 wherein the medium comprises programming configured to cause the processing circuitry to perform processing comprising controlling the display to depict a building plan of the architectural structure, and wherein the accessing the user inputs comprises accessing the user inputs configured to modify the building plan of the architectural structure.

23. The method of claim 1 wherein the analyzing the building plan to identify the presence of conditions appropriate to create a roof comprises analyzing in the absence of user input which instructs the processing circuitry to perform the analyzing.

24. The method of claim 1 further comprising, after the generating the roof, and using the processing circuitry, modifying the roof in the absence of user input which instructs the processing circuitry to modify the roof.

* * * * *

UNITED STATES PATENT AND TRADEMARK OFFICE
CERTIFICATE OF CORRECTION

| | | |
|---|---|---|
| PATENT NO. | : 7,610,181 B2 | Page 1 of 1 |
| APPLICATION NO. | : 11/332009 | |
| DATED | : October 27, 2009 | |
| INVENTOR(S) | : Simpson | |

It is certified that error appears in the above-identified patent and that said Letters Patent is hereby corrected as shown below:

On the Title Page
Item (*) Notice:  Subject to any disclaimer, the term of this patent is extended or adjusted under 35 U.S.C. 154(b) by 539 days.

Delete "539 days" insert --826 days--

Signed and Sealed this

Seventh Day of September, 2010

David J. Kappos
*Director of the United States Patent and Trademark Office*